United States Patent
Deguenther

(10) Patent No.: US 7,969,556 B2
(45) Date of Patent: Jun. 28, 2011

(54) ILLUMINATION OPTICAL SYSTEM FOR MICROLITHOGRAPHY AND ILLUMINATION SYSTEM AND PROJECTION EXPOSURE SYSTEM WITH AN ILLUMINATION OPTICAL SYSTEM OF THIS TYPE

(75) Inventor: Markus Deguenther, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 12/894,611

(22) Filed: Sep. 30, 2010

(65) Prior Publication Data
US 2011/0085151 A1 Apr. 14, 2011

(30) Foreign Application Priority Data

Oct. 14, 2009 (DE) .......................... 10 2009 045 694

(51) Int. Cl.
*G03B 27/54* (2006.01)
*G03B 27/68* (2006.01)
*G03B 27/42* (2006.01)
*G03B 27/72* (2006.01)

(52) U.S. Cl. ................. 355/67; 355/52; 355/53; 355/71

(58) Field of Classification Search .............. 355/52, 355/53, 55, 67–71; 250/492.1, 492.2, 492.22, 250/493.1; 378/34; 359/201.1–203.1, 204.1–204.4
See application file for complete search history.

(56) References Cited

U.S. PATENT DOCUMENTS 6,570,168 B1 * 5/2003 Schultz et al. ............. 250/492.2
6,859,515 B2 * 2/2005 Schultz et al. ................... 378/34

(Continued)

FOREIGN PATENT DOCUMENTS

| DE | 10 2008 009 600 | 8/2009 |
| EP | 1 225 481 | 7/2002 |
| WO | WO 2009/100856 | 8/2009 |

OTHER PUBLICATIONS

Office Action corresponding to German Application No. 10 2009 045 694.5, dated Jul. 23, 2010, with English translation (4 pages).

*Primary Examiner* — Peter B Kim
*Assistant Examiner* — Christina Riddle
(74) *Attorney, Agent, or Firm* — Fish & Richardson P.C.

(57) ABSTRACT

An illumination optical system for microlithography is used to guide an illumination light bundle from a radiation source to an object field in an object plane. A field facet mirror has a plurality of field facets to predetermine defined illumination conditions in the object field. A following optical system is arranged downstream of the field facet mirror to transfer the illumination light into the object field. The following optical system has a pupil facet mirror with a plurality of pupil facets. Some of the field facets are divided into individual mirrors, which predetermine individual mirror illumination channels. The latter illuminate object field portions, which are smaller than the object field. At least some of the individual mirrors are configured as individual correction mirrors. The latter can be tilted between at least two tilting positions, a central region illumination taking place in a basic tilting position and a surrounding region illumination of the object field taking place in a correction tilting position. An illumination optical system is the result, with which a correction of undesired variations of illumination parameters, in particular an illumination intensity distribution over the object field, is possible without loss of light.

13 Claims, 2 Drawing Sheets

U.S. PATENT DOCUMENTS

| | | | |
|---|---|---|---|
| 6,870,554 B2* | 3/2005 | Jain | 345/697 |
| 7,551,263 B2 | 6/2009 | Gruner et al. | |
| 2002/0136351 A1* | 9/2002 | Singer | 378/34 |
| 2003/0038225 A1* | 2/2003 | Mulder et al. | 250/205 |
| 2005/0174650 A1 | 8/2005 | Melzer et al. | |
| 2007/0146853 A1* | 6/2007 | Singer et al. | 359/216 |
| 2009/0046278 A1* | 2/2009 | Kochersperger et al. | 356/138 |
| 2009/0135392 A1* | 5/2009 | Muramatsu | 355/67 |

\* cited by examiner

ILLUMINATION OPTICAL SYSTEM FOR MICROLITHOGRAPHY AND ILLUMINATION SYSTEM AND PROJECTION EXPOSURE SYSTEM WITH AN ILLUMINATION OPTICAL SYSTEM OF THIS TYPE

CROSS-REFERENCE TO RELATED APPLICATIONS

This applications claims priority under 35 U.S.C. §119 to German Patent Application No. DE 10 2009 045 694.5, filed Oct. 14, 2009. The contents of this application is hereby incorporated by reference in its entirety.

BACKGROUND

The disclosure relates to an illumination optical system for microlithography, in particular for EUV microlithography, with a field facet mirror and a following optical system having a pupil facet mirror. The disclosure further relates to an illumination system with an illumination optical system of this type and a projection exposure system with an illumination system of this type. The disclosure further relates to a method for correcting illumination using an illumination optical system of this type. Finally, the disclosure relates to a method for producing a microstructured or nanostructured component and to a component produced by the method.

A projection exposure system with an illumination optical system of this type is known from WO 2009/100 856 A1 and from U.S. Pat. No. 7,551,263 B2.

SUMMARY

The inventors have developed an illumination optical system capable of correcting undesired variations of illumination parameters, in particular an illumination intensity distribution over the object field.

It was recognised that it is possible to influence an illumination intensity distribution over the object field not only by masking individual mirrors, but that illumination light, which, because of a tilting of individual correction mirrors of the field facets, is no longer guided using the basic individual mirror illumination channel associated per se with this field facet to the object field, can nevertheless be used to illuminate the object field. It was recognised that it is certainly possible, apart from the actual field facet image in the object plane, to also use neighbouring and, for example, directly adjacent regions in the object plane for illumination in microlithography. A useful region of the object field, apart from the central region, thus also includes the surrounding region of the object field. Illumination light, which is guided by individual correction mirrors present in the correction tilting position, in other words using the individual correction mirror illumination channels, thus continues to contribute to the object field illumination, unlike masked individual mirrors. On the one hand, an illumination optical system results with a flexible possibility for correcting or compensating undesired variations of illumination parameters, in particular the uniformity of the illumination over the object field height, and, on the other hand, the entire illumination light impinging on all the individual mirrors of a field facet continues to be used efficiently. This can be used for a correction of illumination parameters, in particular for a correction of the illumination intensity distribution over the object field, without loss of light. The advantages of the illumination optical system come to the fore particularly during use for EUV microlithography.

In some embodiments, an illumination optical system can elegantly use pupil facets, which are normally present in any case for the object field illumination of adjacent field facets, for illumination light guidance from individual correction mirrors of a specific field facet adjusted in the correction tilting position. Additional mirror elements to guide the illumination light, which is deflected by the individual correction mirrors in the correction tilting position, are then not required.

In certain embodiments, an offset of field facets with a superimposed imaging of the field facets offset with respect to one another in the object field, leads to the possibility of using this offset for illumination light bundle guidance using the individual correction mirror illumination channels. The uniformity of the object field illumination over the field height can be influenced by this.

In some embodiments, a plurality of individual correction mirrors allows larger net displacements of an illumination intensity over the object field height.

In certain embodiments, individual correction mirrors arranged at an edge facilitate the use of correction pupil facets, which are associated with adjacent field facets. The individual correction mirrors present in the correction tilting position can then be imaged in regions of the object field which are directly adjacent to the central region.

In some embodiments, aspect ratios and an offset limit line course have proven successful in the practice of projection exposure. Instead of rectangular field facets, curved field facets with a corresponding aspect ratio are also possible, which can then also be constructed from individual mirrors and also from individual correction mirrors.

In certain embodiments, a configuration of the useful region of the illuminated object field allows a flexible object field illumination and, accordingly, a flexible correction of illumination parameters. Depending on a required correction or compensation of illumination parameters, the surrounding portions can be illuminated around the central region, selectively and also in regions, by corresponding selection and activation of individual correction mirrors.

Embodiments can be used with an EUV radiation source. An EUV radiation source leads to the possibility of a high structure resolution in the projection exposure.

In a projection exposure system, a correction of a course of the illumination intensity over the object field perpendicular to the scanning direction, in other words over the object field height, may be possible. Portions of the surrounding region of the object field may be arranged before or after the central region of the object field in the displacement direction.

In implementations of an illumination correction method, there may be a provision of selected individual correction mirrors using a calculation using the measured actual intensity distribution of the object field illumination. Alternatively, it is possible to carry out the provision on the basis of a previously produced calibration table, in which the arrangements of the individual correction mirrors associated with the respective determined intensity distribution and allocations of the individual correction mirrors to the correction pupil facets are stored. An intensity distribution of the illumination of the object field can either be measured directly or in derived form. A measurement in derived form may, for example, take place using a measurement of the intensity distribution of the object field in a plane spaced apart from the object plane. Alternatively or additionally it is possible to determine the intensity distribution of the object field illumination in a derived manner using a measurement of other parameters, for example using a measurement of a light distribution of adjusting radiation or entrained radiation of other wavelengths or using a measurement of indirect parameters such as, for example, the heating of certain components or using a scattered light measurement. During the illumination correction, a selection can be made between various tilting states of the individual correction mirrors and a change can optionally be made during the projection exposure.

BRIEF DESCRIPTION OF THE DRAWINGS

An embodiment will be described in more detail below with the aid of the drawings, in which.

DETAILED DESCRIPTION

Figure 1:
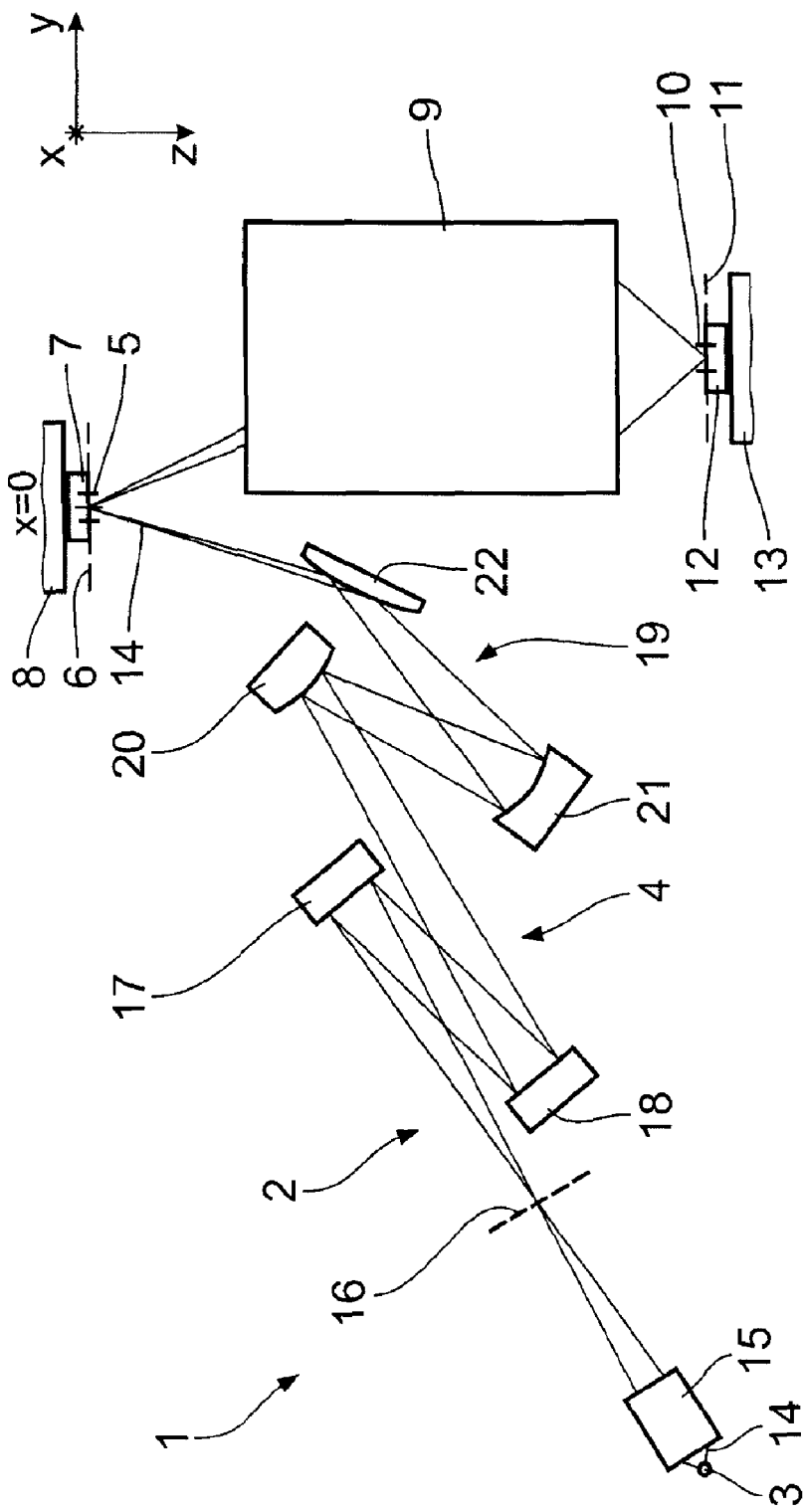
FIG. 1 schematically shows a meridional section through a projection exposure system for EUV projection lithography.

FIG. 1 schematically shows, in a meridional section, a projection exposure system 1 for microlithography. An illumination system 2 of the projection exposure system 1, apart from a radiation source 3, has an illumination optical system 4 for exposing an object field 5 in an object plane 6. A reticle 7 which is arranged in the object field 5 and held by a reticle holder 8 shown merely detail-wise, is exposed here. A projection optical system 9 is used to image the object field 5 in an image field 10 in an image plane 11. A structure on the reticle 7 is imaged on a light-sensitive layer of a wafer 12 which is arranged in the region of the image field 10 in the image plane 11 and is held by a wafer holder 13 also shown schematically.

The radiation source 3 is an EUV radiation source with an emitted useful radiation in the range between 5 nm and 30 nm. This may be a plasma source, for example a GDPP source (gas discharge-produced plasma) or an LPP source (laser-produced plasma). A radiation source, which is based on a synchrotron, can also be used as the radiation source 3. Information on a radiation source of this type can be found, for example, by the person skilled in the art from U.S. Pat. No. 6,859,515 B2. EUV radiation 14, which is emitted from the radiation source 3, is bundled by a collector 15. A corresponding collector is known from EP 1 225 481 A. After the collector 15, the EUV radiation 14 propagates through an intermediate focus plane 16, before it impinges on a field facet mirror 17. The field facet mirror 17 is arranged in a plane of the illumination optical system 4, which is optically conjugated to the object plane 6.

The EUV radiation 14 will also be called illumination light or imaging light below.

After the field facet mirror 17, the EUV radiation 14 is reflected by a pupil facet mirror 18. The pupil facet mirror 18 is arranged in a pupil plane of the illumination optical system 4, which is optically conjugated to a pupil plane of the projection optical system 9. With the aid of the pupil facet mirror 18 and an imaging optical assembly in the form of a transmission optical system 19 with mirrors 20, 21 and 22 designated in the order of the beam path, field facets 23 described in more detail below (cf. FIG. 2) of the field facet mirror 17 are imaged in the object field 5. The last mirror 22 of the transmission optical system 19 is a grazing incidence mirror.

The pupil facet mirror 18 and the transmission optical system 19 form a following optical system for transferring the illumination light 14 into the object field 5. The transmission optical system 19 can be dispensed with, in particular when the pupil facet mirror 18 is arranged in an entry pupil of the projection optical system 9.

To facilitate the description of positional relationships, a Cartesian xyz coordinate system is drawn in FIG. 1 as a global coordinate system to describe the positional relationships of components of the projection exposure system 1 between the object plane 6 and the image plane 11. The x-axis in FIG. 1 runs perpendicular to the drawing plane and into it. The y-axis in FIG. 1 runs to the right. The z-axis in FIG. 1 runs downward, in other words perpendicular to the object plane 6 and to the image plane 11.

The reticle holder 8 and the wafer holder 13 can both be displaced in a controlled manner in such a way that during the projection exposure, the reticle 7 and the wafer 12 are scanned in a displacement direction, namely in the y-direction, on the one hand through the object field 5 and, on the other hand, through the image field 10. The displacement direction y will also be called the scanning direction below.

Figure 2:
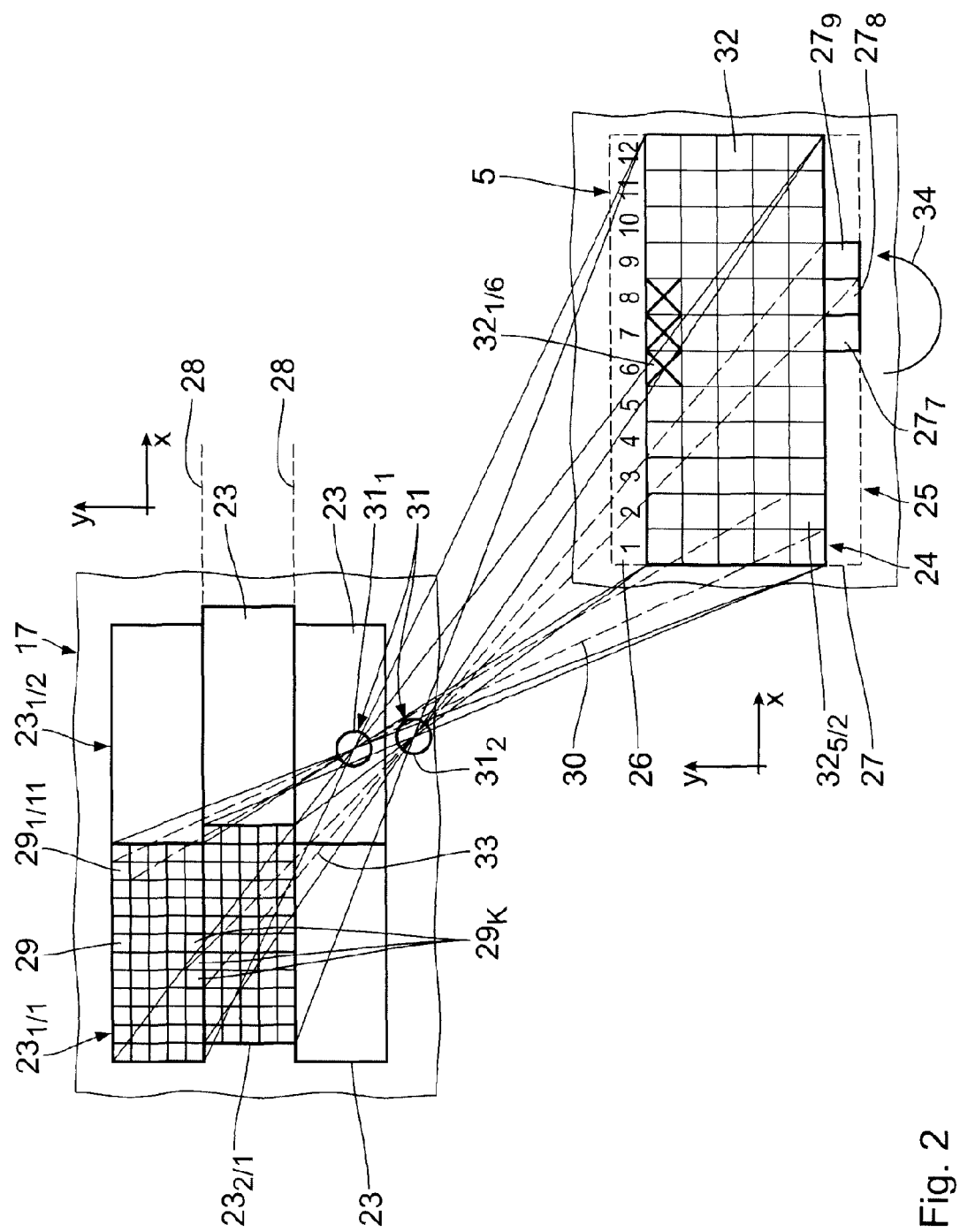
FIG. 2 schematically shows, in a spread out view, imaging conditions in the imaging of adjacent field facets of a field facet mirror of an illumination optical system of an optical system of the projection exposure system, the field facets being imaged in an object field in an object field plane, on the one hand using basic individual mirror illumination channels in a central region of the object field and, on the other hand, using individual correction mirror illumination channels in a surrounding region of the object field.

FIG. 2 schematically shows imaging conditions with regard to the imaging of selected ones of the field facets 23 in the object field 5. The view according to FIG. 2 is spread out, in other words beam paths between the field facets 23 and the object field 5 appear without deflection. In addition, the view according to FIG. 2 is such that a carrier plane of the field facet mirror 17 and the object plane 6 appear to coincide although these two planes (cf. FIG. 1) do not of course coincide. Accordingly, the following optical system 18, 19 is omitted in FIG. 2. To facilitate the description of positional relationships, a Cartesian x-y coordinate system is also drawn in FIG. 2 as a local coordinate system of the field facet mirror 17 and the object field 5. The x-direction and the y-direction of the coordinate system according to FIG. 2, in the object field 5, correspond to the x-direction and the y-direction according to FIG. 1.

The object field 5 has a useful region with an inner central region 24 and a surrounding region 25. The regions 24, 25 are regions of the object field 5 used for the projection exposure.

The object field central region 24 is shown by a continuous line FIG. 2 and has an aspect ratio between a larger field dimension x and a smaller field dimension y, which is greater than 1 and is 12:5 in the embodiment shown. Other x-y aspect ratios, for example 25/4 or 104/8, are also possible. An x-y aspect ratio of the field facets 23 corresponds to the x-y aspect ratio of the object field 5.

The object field surrounding region 25 is divided into two surrounding portions 26, 27, which in FIG. 2, adjoin directly above and below the central region 24 of the object field 5.

The object field surrounding portion 26 adjoins the object field central region 24 in the positive scanning direction y. The object field surrounding portion 27 adjoins the central region 24 in the negative scanning direction y.

A portion of the field facet mirror 17 with six field facets 23 is shown at the top left of FIG. 2. Three groups each with two field facets 23 directly adjacent to one another in the x-direction are shown. These field facet groups are offset in relation to one another in the x-direction and are arranged separated from one another by offset limit lines 28, which run parallel to the x-direction. The field facets within these groups will be designated $23_{x/y}$ below, x designating the line position and y the column position of the respective field facet 23. Lines will be numbered consecutively from top to bottom and columns from left to right.

Each of the field facets 23 is divided into a plurality of individual mirrors 9. A total reflection face of the respective field facet 23 is in this case divided line-wise and column-wise into a grid of the individual mirrors 29. In the embodiment shown, each field facet 23 is divided into twelve columns located next to one another, each with five individual mirrors 29, in other words has five lines and twelve columns. The individual mirrors 29 of a respective field facet will be designated $29_{x/y}$ below, x designating the line position and y the column position of the respective individual mirror 29 of the field facet 23.

A division of this type of field facets into individual mirrors is known from WO 2009/100 856 A1, reference being made to the content thereof in its entirety.

In the field facet mirror 17, not all the field facets 23 have to be divided into individual mirrors 29. The entire reflection face of one of the field facets 23 also does not have to necessarily be divided into individual mirrors 29.

The individual mirrors 29 predetermine individual mirror illumination channels 30 for the guidance of sub-fractions, which impinge on the individual mirrors 29, of the bundle of illumination light 14 impinging on the field facet mirror 17. An illumination channel 30 of this type is shown by dashed lines in FIG. 2 for the individual mirror $29_{1/11}$, in other words for the individual mirror 29 in the first line and the eleventh column of the field facet 23 shown at the top left of FIG. 2.

The pupil facet mirror 18 has a plurality of pupil facets 31. The number of pupil facets 31 is at least as large as the number of field facets 23. The field facets 23 are in each case individually associated with the pupil facets 31, so fractions of the bundle of illumination light 14, which impinge on one of the field facets 23 in each case, are guided via the associated pupil facet 31 onward to the object field 5 for the imaging of the field facet 23 in the object field 5. The individual mirror illumination channel 30 of the individual mirror $29_{1/11}$ is reflected by the pupil facet $31_1$ shown at the top in FIG. 2 and imaged toward the object field 5 in an object field portion 32 in the central region 24 of the object field 5.

The central region 24 of the object field 5, for illustration in FIG. 2, is also divided into grid elements in five lines and twelve columns, each of the grid elements corresponding to one of the object field portions 32. Because of the negative imaging scale in the embodiment in the imaging of the field facets 23 in the object plane 6, the individual mirror $29_{1/11}$ is imaged in the object field portion $32_{5/2}$, in other words in the object field portion 32, which is arranged in the fifth line and in the second column of the central region 24 of the object field 5.

The individual mirror illumination channels 30 of the individual mirrors 29 illuminate in the central region 24 of the object field 5, in other words the object field portions 32, which are smaller than the object field 5.

The surrounding portions 26 and 27 are in each case one-lined. Object field portions within the surrounding portions 26, 27 can therefore be described by a single index, which represents the column position of the object field portion within the respective surrounding portion 26, 27. This column numbering is shown for the object field portion 26 in FIG. 2.

Some of the individual mirrors 29 of the field facets 23 of the field facet mirror 17 are configured as an individual correction mirrors $29_K$. In the embodiment shown in FIG. 2, three individual correction mirrors $29_K$ are active, namely the individual correction mirrors $29_{K5/5}$, $29_{K5/6}$ and $29_{K5/7}$. The field facet $23_{1/1}$ shown at the top left in FIG. 2 thus has three active individual correction mirrors $29_K$, which are arranged at an edge of the field facet 23. The active individual correction mirrors 29 are arranged directly adjacent to one another parallel to the offset limit line 28.

Each of the individual correction mirrors $29_K$ is connected to an actuator for the individual deflection of impinging illumination light 14. More detail regarding the configuration of actuators for the individual mirrors of a field facet mirror are provided in WO 2009/100 856 A1.

The active individual correction mirrors $29_K$ of the field facet $23_{1/1}$ are not guided like all the other individual mirrors 29 of this field facet $23_{1/1}$ via individual mirror illumination channels 30 to the object field 5, which run through the pupil facet $31_1$, but via individual correction mirror illumination channels 33, which are guided via the pupil facet $31_2$ shown at the bottom in FIG. 2. One of these individual correction mirror illumination channels 33 is shown by dashed lines in FIG. 2.

The individual correction mirrors $29_K$ can be configured to tilt between two tilting positions. In a non-active basic tilting position of the individual correction mirrors $29_K$, an illumination of the central region 24 of the object field 5 takes place using a basic individual mirror illumination channel 30. In an active correction tilting position of the individual correction mirrors $29_K$, an illumination of one of the surrounding portions 26, 27 of the object field surrounding region 25 takes place using the respective individual correction mirror illumination channel 33.

The illumination in the basic tilting position takes place using the basic pupil facet individually associated in each case with the field facet 23, in the case of the field facet $23_{1/1}$, in other words, using the pupil facet $31_1$. In the correction tilting position, the illumination takes place using a correction pupil facet differing from the basic pupil facet, in the case of the active individual correction mirrors $29_K$ in FIG. 2, in other words, using the pupil facet $31_2$, which is associated with the adjacent field facet $23_{2/1}$.

Because of the adjustment of the three active individual correction mirrors $29_K$ in FIG. 2, these are no longer imaged using the basic pupil facet $31_1$ on the object field portions $32_{1/6}$, $32_{1/7}$ and $32_{1/8}$ of the central region 24, which is made clear in FIG. 2 by crossing these object field portions. Instead, an imaging takes place of the individual correction mirrors $29_K$ in the object field portions $27_7$, $27_8$ and $27_9$ of the surrounding portion 27.

The field facet $23_{2/1}$ arranged below the field facet $23_{1/1}$ in FIG. 2 is arranged offset by an individual mirror width in the positive x-direction along the offset limit line 28. This field facet $23_{2/1}$ is imaged using the pupil facet $31_2$ shown at the bottom in FIG. 2 in the central region 24 of the object field 5.

Because of the offset of the field facet $23_{2/1}$ relative to the field facet $23_{1/1}$, the imaging of the three active individual correction mirrors $29_K$ using the pupil facet $31_2$ associated with the field facet $23_{2/1}$ also takes place offset in the x-direction, specifically offset by the width of an object field portion 32 in the positive x-direction because of the imaging scale.

Because of the activation of the three individual correction mirrors $29_K$ a displacement has taken place, in a net and integrated manner over the scanning direction y, of the illumination of an object field portion 32 in the sixth column of the object field 5 toward an additional illumination of the object field portion $27_9$ in the ninth column of the object field. This displacement is illustrated in FIG. 2 by an arrow 34. This displacement 34 can be used to correct or to compensate an illumination intensity over the object field height, in other words over the x-dimension of the object field 5.

By activating other individual correction mirrors $29_K$ or other groups of individual correction mirrors $29_K$, other displacements 34 can be produced. If, for example, only the individual correction mirror $29_{K5/5}$ is activated, this lead to a loss of the illumination of the object field portion $32_{1/8}$ and to an additional illumination of the object field portion $27_9$, in other words to a displacement 34 of an illumination of portions of the object field 5 from the eighth to the ninth column. Other displacements can be correspondingly produced.

The net displacement because of the use of a further pupil facet 31 for a specific field facet 23, which is not the basic pupil facet of this specific field facet 23, but the basic pupil facet of an adjacent field facet 23, depends on the offset of the adjacent field facets 23 to one another. This further pupil facet 31 is also called a correction pupil facet. In the embodiment shown in FIG. 2, the offset between the field facets $23_{1/1}$ and $23_{2/1}$ is a mirror width in the positive x-direction. If this offset were different, for example two individual mirror widths in the positive x-direction or an individual mirror width in the negative x-direction, the possibility would correspondingly result of a displacement 34 by two object field portion widths in the positive x-direction or by one object field portion width in the negative x-direction. The direction and the size of the displacement 34 can therefore be predetermined using the selection of the offset of adjacent field facets, the pupil facets of which are alternately used for correction illumination.

In the situation shown in FIG. 2, conversely, by activating individual correction mirrors $29_K$ of the field facet $23_{2/1}$, which are imaged using the pupil facet $31_1$ in the surrounding portion 26 of the object field 5, an offset 34 can be produced in the negative x-direction. Individual correction mirrors $29_K$ of the field facet $23_{2/1}$ from the uppermost individual mirror line of the field facet $23_{2/1}$ are used here.

An illumination correction is carried out with the aid of the illumination optical system 4 as follows: firstly, with the aid of a corresponding detector, an intensity distribution of the illumination of the object field 5 over the field height x is determined. With the aid of this measurement result individual correction mirrors $29_K$ to be activated are selected, so a measured actual uniformity can be converted into a predetermined desired uniformity within predetermined tolerance limits.

The uniformity U(x) is defined as follows:

$$U(\%) = 100 \frac{I(x) - (x=0)}{I(x=0)}.$$

x=0 corresponds here to an x-position, in other words a field height, in the centre of the object field 5.

Following this, the projection exposure then takes place, in which the reticle 7 and the wafer 12, which carries a light-sensitive coating for the illumination light 14, are provided and then at least one portion of the reticle 7 is projected onto the wafer 12 with the aid of the projection exposure system 1. Finally, the light-sensitive layer exposed with the illumination light bundle 14 is developed on the wafer 12. In this manner, the microstructured or nanostructured component, for example a semiconductor chip, is produced.

Using the various variants of the arrangement of the individual correction mirrors $29_K$ described above, the bundle guidance effect thereof can be dynamically controlled. For this purpose, the individual correction mirrors $29_K$ can be activated by a control device of the projection exposure system. This activation may, in this case, take place on the basis of measurements of the intensity course over the long field dimension, in other words the x-direction, in the object field or else in the image field.

Other embodiments are in the following claims.

The invention claimed is:

1. An illumination optical system for microlithography for guiding an illumination light bundle from a radiation source to an object field in an object plane, the illumination optical system comprising:
    a field facet mirror with a plurality of field facets arranged to define predetermined illumination conditions in the object field,
    a following optical system arranged downstream of the field facet mirror, the following optical system being configured to transfer the illumination light into the object field,
    wherein the following optical system has a pupil facet mirror with a plurality of pupil facets, the field facets being in each case individually associated with the pupil facets so fractions of the illumination light bundle, which impinge on one of the field facets are guided onward via the associated pupil facet to the object field,
    wherein at least some of the field facets are divided into individual mirrors, which predetermine individual mirror illumination channels to guide sub-fractions of the illumination light bundle impinging on the individual mirrors,
    wherein the individual mirrors each have a mirror face arranged so that the individual mirror illumination channels in the object field illuminate object field portions which are smaller than the object field,
    wherein at least some of the individual mirrors are configured as individual correction mirrors,
    wherein the individual correction mirrors are configured to be tiltable between at least two tilting positions including a basic tilting position and a correction illumination position,
    wherein in the basic tilting position of the individual correction mirrors, an illumination of a central region of the object field takes place using a basic individual mirror illumination channel of the individual correction mirrors, and in the correction tilting position of the individual correction mirrors, an illumination of a surrounding region of the object field takes place using an individual correction mirror illumination channel of the individual correction mirrors, the surrounding region of the object field being adjacent to the central region in the object plane.

2. The illumination optical system of claim 1, wherein the individual correction mirrors are configured to tilt between the two tilting positions in such a way that in the basic tilting position an illumination of the central region of the object field takes place using the basic individual mirror illumination channel of the individual correction mirrors and an individually associated basic pupil facet of the pupil facet mirror, and in the correction tilting position an illumination of the surrounding region of the object field takes place using the individual correction mirror illumination channel of the individual correction mirrors and a correction pupil facet of the pupil facet mirror, the correction pupil facet being different from the basic pupil facet.

3. The illumination optical system of claim 2, wherein at least some of the field facets are arranged adjacent to one another and separated by a displacement limit line on the field facet mirror, the individual mirrors of one of the adjacent field facets being associated in a basic position with the correction pupil facet using basic individual mirror illumination channels, the individual mirrors of the one adjacent field facet being arranged offset along the displacement limit line with respect to individual mirrors of another adjacent field facet, the individual mirrors of the other adjacent field facet being associated with the correction pupil facet in the correction tilting position using individual correction mirror illumination channels.

4. The illumination optical system of claim 3, wherein the one adjacent field facet comprises a plurality of individual correction mirrors arranged directly adjacent to one another and parallel to the displacement limit line.

5. The illumination optical system of claim 1, wherein at least some of the individual correction illumination mirrors are arranged on an edge of the field facet.

6. The illumination optical system of claim 1, wherein the object field has an aspect ratio between a larger field dimension and a smaller field dimension which is greater than 1, the field facets having a corresponding aspect ratio and offset limit lines run between the field facets substantially along the larger field dimension.

7. The illumination optical system of claim 1, wherein the individual correction mirrors are configured to tilt between the two tilting positions in such a way that in the correction tilting position of the individual correction mirrors, two portions of the surrounding region of the object field are illuminated, where the two portions of the surrounding region receive the central region of the object field between them.

8. An optical system, comprising:
an illumination optical system according to claim 1; and
a projection optical system for projecting the object field on an image field.

9. A projection exposure system, comprising:
an optical system comprising:
an illumination optical system according to claim 1; and
a projection optical system for projecting the object field on an image field; and
an EUV radiation source for producing the illumination light bundle.

10. The projection exposure system of claim 9, further comprising:
a reticle holder configured to be displaced in a controlled manner so that during a projection exposure a reticle is scanned in a displacement direction through the object field, the surrounding region of the object field being illuminated by the individual correction mirrors in the correction tilting position adjoining the central region of the object field along the displacement direction.

11. A method for correcting illumination using an illumination optical system according to claim 1, the method comprising:
determining an actual intensity distribution of an illumination of the object field with the illumination light bundle of the radiation source;
predetermining a desired set intensity distribution; and
providing a tilting position of selected individual correction mirrors so that the desired set intensity distribution is produced.

12. A method for producing a microstructured component comprising:
providing a reticle;
providing a wafer with a light-sensitive coating for an illumination light bundle;
projecting at least a portion of the reticle onto the wafer with the aid of a projection exposure system which comprises:
an optical system, comprising:
an illumination optical system according to claim 1; and
a projection optical system for projecting the object field on an image field; and
an EUV radiation source for producing the illumination light bundle; and
developing the light-sensitive layer exposed with the illumination light bundle on the wafer.

13. The method of claim 12, further comprising, before projecting at least the portion of the reticle onto the wafer:
determining an actual intensity distribution of an illumination of the object field with the illumination light bundle of the radiation source;
predetermining a desired set intensity distribution; and
providing a tilting position of selected individual correction mirrors so that the desired set intensity distribution is produced.

* * * * *

UNITED STATES PATENT AND TRADEMARK OFFICE
CERTIFICATE OF CORRECTION

PATENT NO. : 7,969,556 B2
APPLICATION NO. : 12/894611
DATED : June 28, 2011
INVENTOR(S) : Markus Deguenther It is certified that error appears in the above-identified patent and that said Letters Patent is hereby corrected as shown below:

Column 7, Line 45 (approx.)

Delete $$U(\%) = 100 \frac{I(x) - (x=0)}{I(x=0)}$$

" ."

And insert $$U(\%) = 100 \frac{I(x) - I(x=0)}{I(x=0)}$$

-- .--

Signed and Sealed this
Ninth Day of August, 2011

David J. Kappos
*Director of the United States Patent and Trademark Office*